US011380634B2

(12) United States Patent
de Graauw et al.

(10) Patent No.: US 11,380,634 B2
(45) Date of Patent: Jul. 5, 2022

(54) APPARATUSES AND METHODS FOR COUPLING A WAVEGUIDE STRUCTURE TO AN INTEGRATED CIRCUIT PACKAGE

(71) Applicant: NXP B.V., Eindhoven (NL)

(72) Inventors: Antonius Johannes Matheus de Graauw, Haelen (NL); Antonius Hendrikus Jozef Kamphuis, Lent (NL); Sander Jacobus Geluk, Eindhoven (NL)

(73) Assignee: NXP B.V., Eindhoven (NL)

( * ) Notice: Subject to any disclaimer, the term of this patent is extended or adjusted under 35 U.S.C. 154(b) by 570 days.

(21) Appl. No.: 16/415,069

(22) Filed: May 17, 2019

(65) Prior Publication Data

US 2020/0365535 A1    Nov. 19, 2020

(51) Int. Cl.
*H01L 23/66*     (2006.01)
*G01S 7/03*      (2006.01)
(Continued)

(52) U.S. Cl.
CPC .............. *H01L 23/66* (2013.01); *G01S 7/032* (2013.01); *H01L 23/4952* (2013.01); *H01L 23/552* (2013.01); *H01L 24/48* (2013.01); *H01L 2223/6616* (2013.01); *H01L 2223/6627* (2013.01); *H01L 2223/6677* (2013.01); *H01L 2224/48177* (2013.01)

(58) Field of Classification Search
CPC ... H01L 23/66; H01L 23/4952; H01L 23/552; G01S 7/032
See application file for complete search history.

(56) References Cited

U.S. PATENT DOCUMENTS

| 9,136,230 B2 | 9/2015 | Demin et al. |
| 9,318,449 B2 | 4/2016 | Hasch et al. |

(Continued)

FOREIGN PATENT DOCUMENTS

| CN | 109687165 A | 4/2019 |
| WO | WO 2018057006 A1 | 3/2018 |

OTHER PUBLICATIONS

Yang, Z., "A Compact and Broadband Differential Microstrip Line to Rectangular Waveguide Transition Using Dipole Antenna", Journal of Infrared, Millimeter and Terahertz Waves, vol. 37, No. 6, Feb. 4, 2016.

(Continued)

*Primary Examiner* — Marc Anthony Armand

(57) ABSTRACT

Aspects are directed to a waveguide structure that can couple to an integrated circuit package. The IC package includes a plurality of pillars to provide a path for carrying millimeter-wave signals, each of the pillars having a first end portion to connect to the IC package and a second end portion to connect to a waveguide antenna. Also, as may be optionally included, waveguide shields provide electromagnetic isolation for the pillars and a micro-strip connector to provide connection between the second end portions (of the pillars) and to the waveguide antenna. Further included in the apparatus are a plurality of bond wires to connect the IC package and a lead frame, and to carry signals form circuitry of the IC package to the printed circuit board on which the package is mounted for transmission of radar signals via the waveguide antenna.

18 Claims, 7 Drawing Sheets

(51) Int. Cl.
  *H01L 23/495* (2006.01)
  *H01L 23/552* (2006.01)
  *H01L 23/00* (2006.01)

(56) References Cited

U.S. PATENT DOCUMENTS

| | | | |
|---|---|---|---|
| 2006/0001572 | A1 | 1/2006 | Gaucher et al. |
| 2007/0164907 | A1* | 7/2007 | Gaucher .................. H01Q 1/38 343/700 MS |
| 2008/0291115 | A1 | 11/2008 | Doan et al. |
| 2011/0095948 | A1* | 4/2011 | Alexopoulos ............ H01Q 1/48 343/700 MS |
| 2014/0291835 | A1 | 10/2014 | Demin et al. |
| 2016/0293557 | A1 | 10/2016 | Topak et al. |
| 2018/0233465 | A1 | 8/2018 | Spella et al. |

OTHER PUBLICATIONS

Won Ho Kim, Jong Woo Shin and Jeong Phill Kim, "Equivalent network modeling of slot coupled microstripline to waveguide transition," IEEE Antennas and Propagation Society Symposium, 2004., 2004, pp. 2345-2348 vol. 3. (Abstract Only).

Yonggang Jin et al., "Next generation eWLB (embedded wafer level BGA) packaging," 2010 12th Electronics Packaging Technology Conference, Singapore, 2010, pp. 520-526.

J. Hamelink, R. H. Poelma and M. Kengen, "Through-polymer-via for 3D heterogeneous integration and packaging," 2015 IEEE 17th Electronics Packaging and Technology Conference (EPTC), Singapore, 2015, pp. 1-7. (Abstract Only).

\* cited by examiner

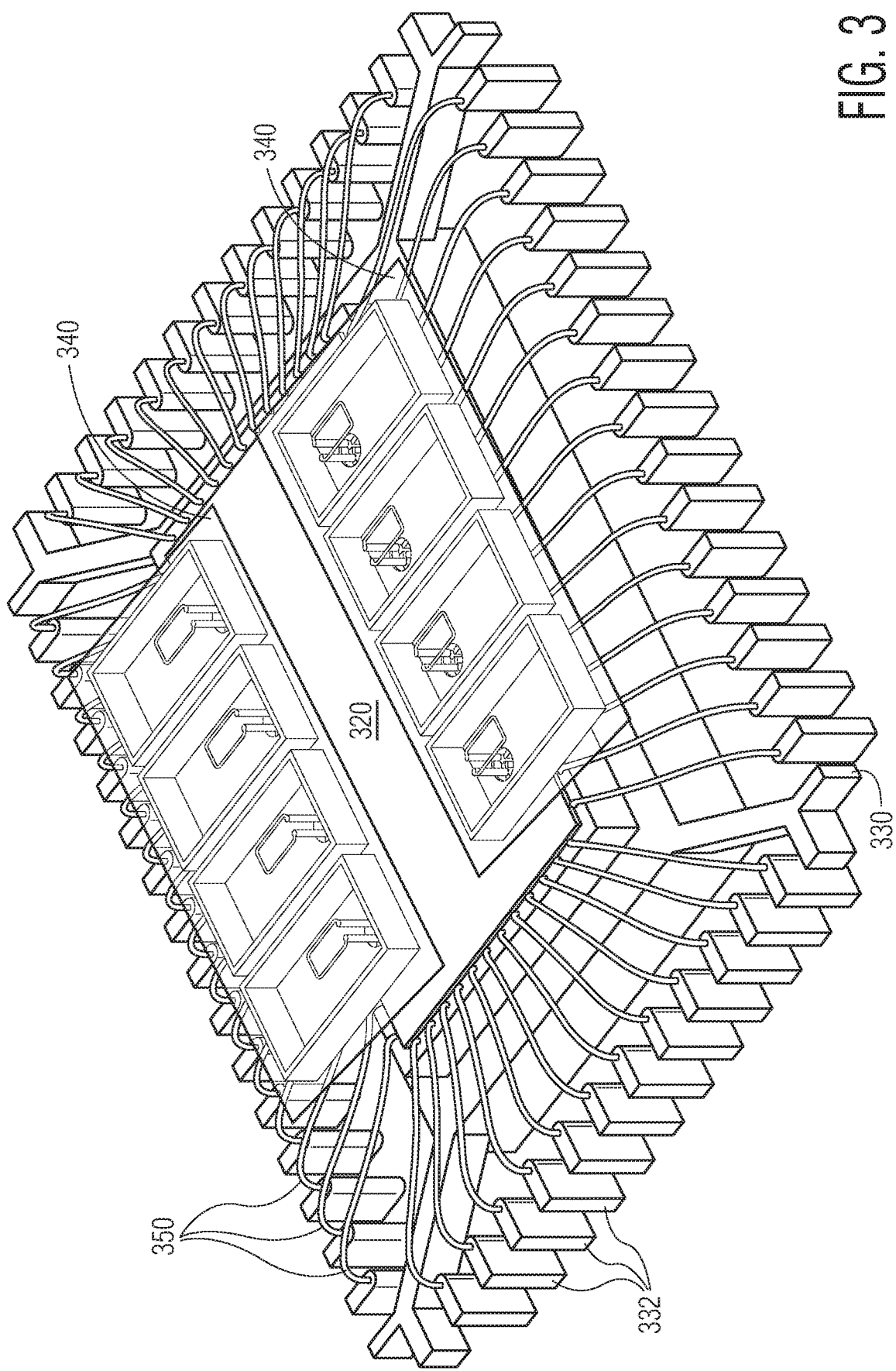

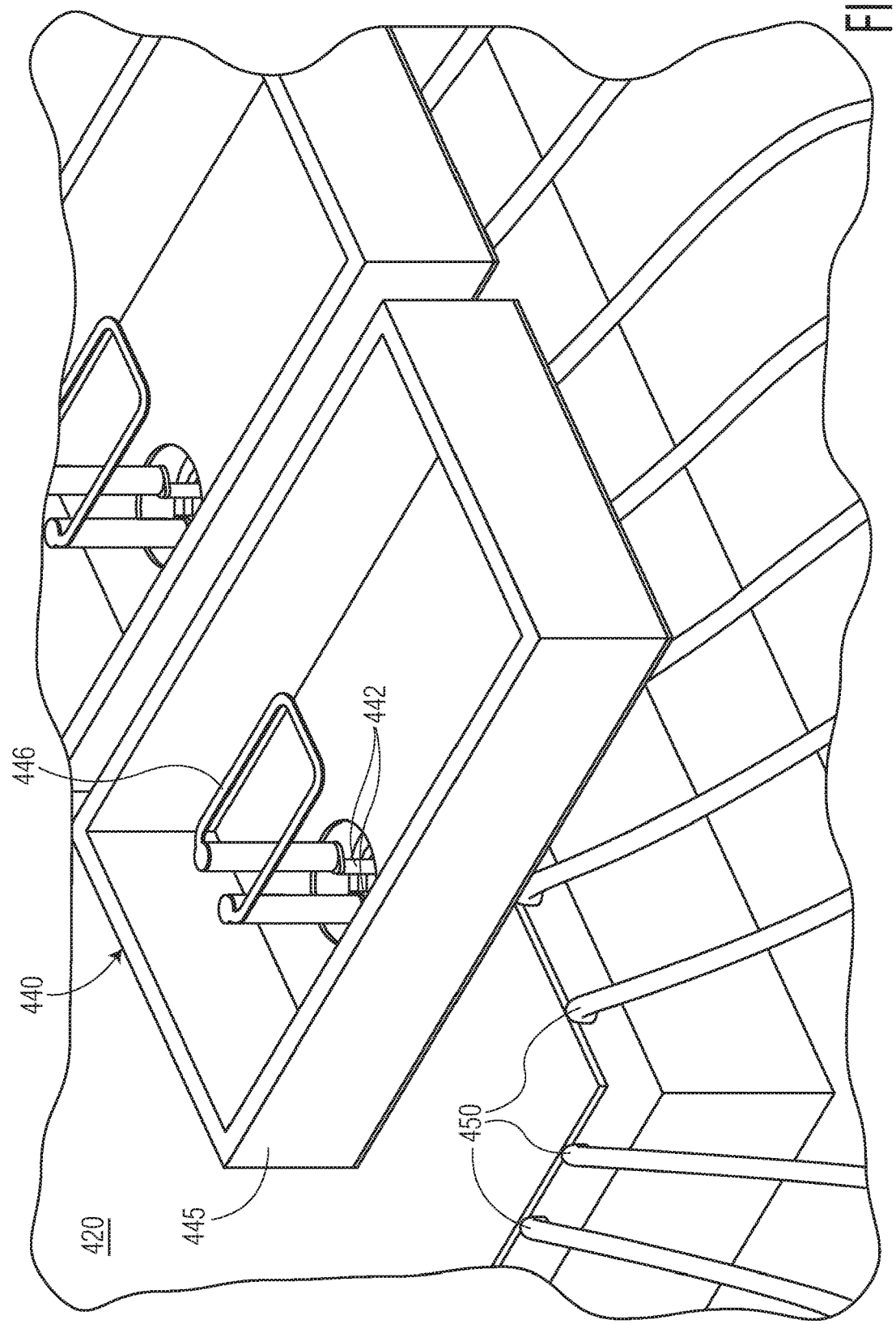

APPARATUSES AND METHODS FOR COUPLING A WAVEGUIDE STRUCTURE TO AN INTEGRATED CIRCUIT PACKAGE

OVERVIEW

Aspects of various embodiments are directed to millimeter-wave integrated circuits including a waveguide structure and an integrated circuit (IC) package.

Generating enough power to transmit and achieving enough sensitivity to detect the weak signals of millimeter-wave (mm-wave) systems is limited by semiconductor constraints. To minimize power losses due to waves radiated and detected by an antenna array coupled to a waveguide structure, a variety of limitations of the semiconductor technology with which the system was manufactured have to be taken into consideration. Circuitry included within the IC package couples with minimal energy losses to waves radiated and detected by the antenna array. —Increased performance related to increased communication bandwidth and detection resolution can be obtained by extending the system complexity from Single Input Single Output (SISO) to Multiple Input Multiple Output (MIMO), and by moving from Simplex to Full-Duplex operation. High performance MIMO systems require minimum energy loss to the antennas for all the in- and outputs and high isolation between them.

These and other matters have presented challenges to efficiencies of mm-wave integrated circuit package implementations, for a variety of applications.

SUMMARY

Various example embodiments are directed to issues such as those addressed above and/or others which may become apparent from the following disclosure concerning an integrated circuit including a waveguide structure coupled to an integrated circuit package for transmitting or receiving mm-wave signals.

In certain example embodiments, aspects of the present disclosure involve a waveguide structure coupled to an IC package including pillars to provide paths for carrying mm-wave signals and waveguide shields to provide electro-magnetic isolation between the pillars that carry signals from different transmit or receive paths.

Various embodiments are directed to an apparatus including a waveguide structure to couple to an integrated circuit (IC) package. The IC package includes a plurality of pillars to provide a path for carrying millimeter-wave signals, each of the pillars having a first end portion to connect to the IC package and a second end portion to connect to a waveguide antenna. Also optionally included are waveguide shields to provide electro-magnetic isolation for the pillars and a micro-strip connector to provide connection between the second end portions and the waveguide antenna. Further included are bond-wires to connect the IC package and a lead frame, and to carry signals from circuitry of the IC package to the board on which the IC package is mounted for transmission of radar signals via the waveguide antenna.

In additional embodiments, aspects are directed to an apparatus including a waveguide antenna and an IC package including circuitry to send signals from the IC package. Also included are bond-wires to connect the IC package and a lead frame, and to carry signals from circuitry of the IC to the board, such as a printed circuit board (PCB), on which the package is mounted for transmission of radar signals via the waveguide antenna.

The waveguide structure is to provide a low impedance pathway for the propagation of millimeter-wave signals in TE10 mode. Further, the pathway is to provide for the propagation of the millimeter-wave signals via guided TEM-wave signals, the pathway having an optimized path length over which the millimeter-wave signals propagate so that attenuation by conductive and dielectric losses are minimized.

In other embodiments, the waveguide structure and the plurality of pillars provide a plurality of differential signal paths. The pillars in combination with the optional waveguide shields are arranged to reduce undesired coupling between immediately-adjacent signal pathways communicatively connecting the waveguide structure and circuitry to the IC package. In various related embodiments, the IC package can include an interface at which a micro-strip line is to connect to the waveguide structure, the waveguide structure defining a slot through which non-galvanic proximity coupling is provided with the micro-strip line at the interface of the IC package, the slot being further defined to minimize energy losses during mm-wave energy transfer.

In other specific example embodiments, a radar system includes an integrated circuit including an IC package, a lead frame, and circuitry to communicate signals for radar communications. A waveguide system is coupled to the IC package, which includes conductive walls characterizing one or more apertures through which electro-magnetic signals are transmitted. Also included are pillars located in the one or more apertures to provide a mm-wave signal path, the pillars having a respective first end portion connected to the IC package and second end portions to connect to a waveguide antenna. Waveguide shields are optionally included to provide electro-magnetic isolation of the pillars, and a micro-strip connector provides connection between the second end portions and to the waveguide antenna. Bond wires connect the IC package and the lead frame, and carry the signals from the circuitry of the IC to the board on which the IC package is mounted for transmission via the waveguide antenna.

In connection with more specific embodiments (also relating the above-characterized systems and structures), additional aspects of the present disclosure are directed to a radar system having waveguide shields including axial-metal shields to provide impedance control of a transmission line for the propagation of mm-wave signals in TE10 mode. The pillars can include multiple sets of two pillars to present a differential signal for launching via the waveguide antenna. In more specific embodiments, the waveguide structure provides a transmission line for transmission of the signals carried from the circuitry of the IC for transmission as radar signals from the waveguide antenna.

In additional specific example embodiments, aspects of the present disclosure are directed to a method for transmitting or receiving signals for radar communication using a waveguide structure coupled to an integrated circuit package. Pillars in an aperture of the waveguide structure provide a mm-wave signal path from respective first end portions of the pillars along the pillars and to second end portions of the pillars to connect to a waveguide antenna. Waveguide shields are used to provide electro-magnetic isolation for the pillars. Via a micro-strip connector, a connection is provided between the second end portions and the waveguide antenna, launching mm-wave signals, which can include causing the mm-wave signals to propagate in TE10 mode.

In more-specific embodiments, the waveguide shields can include multiple sets of pillars, each set surrounded by an axial-metal shield to provide impedance control of a transmission line for the propagation of the mm-wave signals. Additionally and/or alternatively each of the multiple sets of pillars is to present a differential signal for launching via the waveguide antenna.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIG. 3 illustrates an internal view of an integrated circuit package, in accordance with the present disclosure;

FIG. 4A illustrates circuitry included in an integrated circuit package, in accordance with the present disclosure;

Figure 1A:
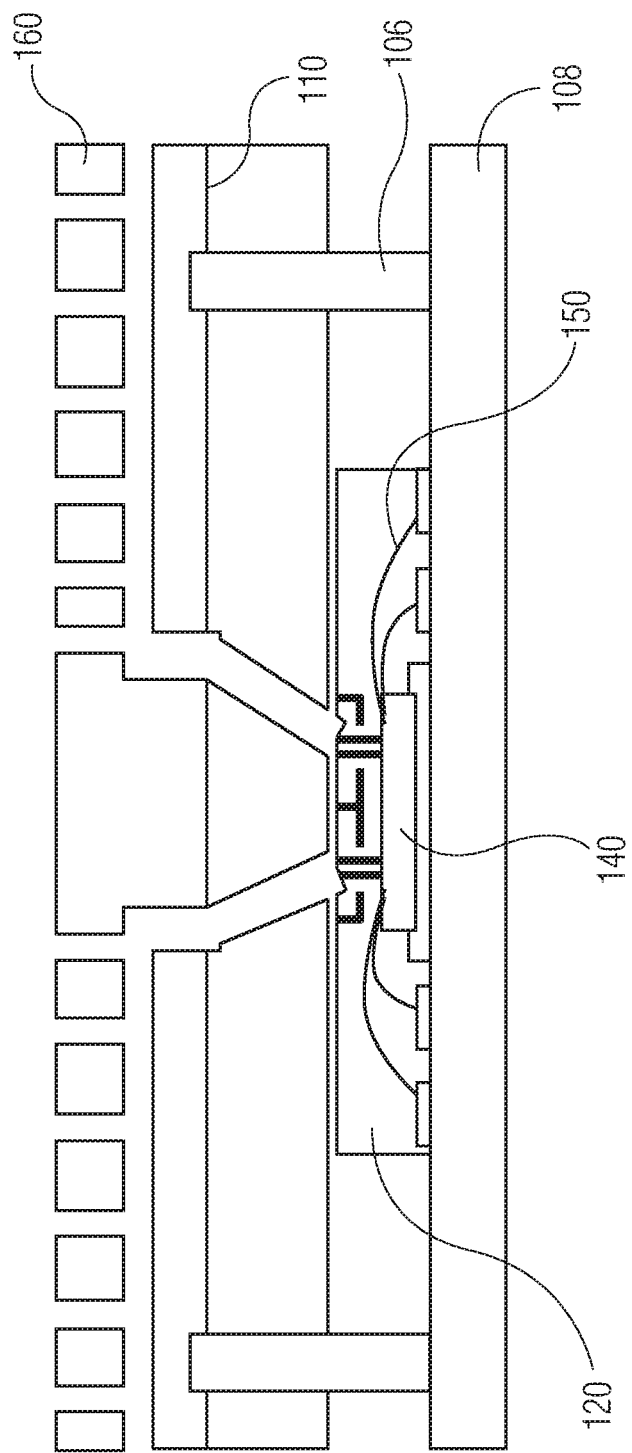
FIG. 1A illustrates a waveguide structure coupled to an integrated circuit package, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving an IC including a waveguide structure to couple to an IC package, the IC further including pillars to provide signal paths for carrying mm-wave signals for transmission. In certain implementations, aspects of the present disclosure have been shown to be beneficial when used in the context of telecommunications systems (e.g., 5G cellular networks) and radar systems operating in the 76-81 GHz frequency band (e.g., those found in automobiles). While not necessarily so limited, various aspects may be appreciated through the following discussion of non-limiting examples which use exemplary contexts.

Aspects of the present disclosure are directed to efficient transfer of differential mm-wave signals from an IC package to a waveguide antenna array based upon sufficiently close proximity coupling of a micro-strip line in the IC package, so that waveguide-coupling losses are minimized. In certain telecommunications/radar systems, minimizing such losses can be important and in such systems, transferring differential mm-wave signals in such a fashion is suitable for connecting the transmitter and receiver input/output interfaces of the mm-wave IC to waveguide-based antenna arrays given comparably low interconnect losses resulting in a larger radiated power and an improved receiver sensitivity.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Again with exemplary reference to implementations in telecommunications/radar systems, the generation of enough power to transmit and sufficient sensitivity to detect signals in mm-wave communications and radar systems is limited by semiconductor constraints, such as maximum unity gain frequency ($F_{max}$), breakdown voltage ($V_{bd}$), and minimum noise figure ($NF_{min}$). To minimize power losses due to waves radiated and detected by an antenna array included in and/or coupled to an integrated circuit (IC) package, using low cost semiconductor technologies and accounting for the aforementioned limitations, circuitry included in the IC package may couple with minimum energy loss to waves radiated and detected by the antenna array (e.g., the mm-wave signal) in order to realize high performance systems. Such systems can include, for example, telecommunications and radar systems. Increased communication bandwidth and detection resolution can be obtained by extending the system complexity from Single Input Single Output (SISO) to Multiple Input Multiple Output (MIMO), and by moving from Simplex to Full-Duplex operation. High performance MIMO systems require minimum energy loss to the antennas for all the in- and outputs and high isolation between them.

Figure 1B:
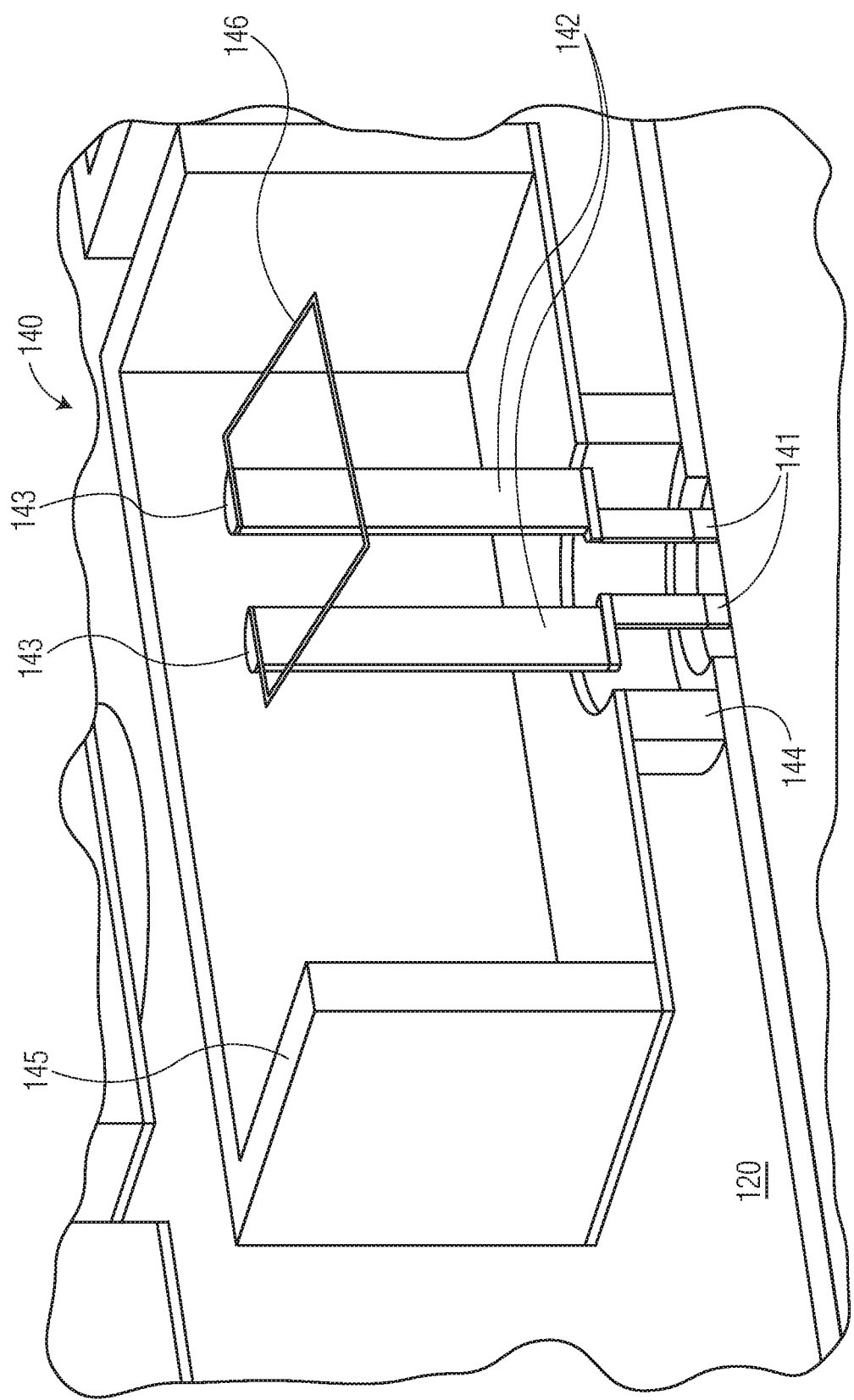
FIG. 1B illustrates circuitry included in an integrated circuit package, in accordance with the present disclosure.

Turning now to the figures, FIG. 1A and FIG. 1B illustrate a waveguide structure 110 to couple an integrated circuit (IC) package 120. A mechanical support structure 106 provides mechanical support between the waveguide structure 110 and the board on which the IC package is mounted 108. A fan-out structure, which may, for instance, include apertures and slots (see 216 and 218 of FIG. 2), directs mm-wave signals from the board on which the IC package is mounted 108 up through the waveguide structure 110 and into the waveguide antenna array 160.

FIG. 1B illustrates circuitry 140 which may be included in the IC package 120 having a plurality of pillars 142 to provide a path for carrying millimeter-wave signals. Each of the pillars 142 has a first end portion 141 to connect to the IC package 120 and a second end portion 143 to connect to a waveguide antenna (not shown). Also depicted in FIG. 1B are waveguide shields 145 to provide electro-magnetic isolation for the pillars 142, and a micro-strip connector 146 to provide connection between the second end portions 143 and to the waveguide antenna 160. A plurality of bond wires 150 are included to connect the IC package 120 and a lead frame (e.g., 230 in FIG. 2) and to carry signals form circuitry 140 of the IC package 120 to the board on which the IC package is mounted 108 for transmission of radar signals via the waveguide antenna 160. The pillars 142 may be solid metal, organic pillars with a metal plating, or a combination thereof.

Millimeter (mm) wave connections are realized by the pillars 142 from the active side of the IC package 120 to a micro-strip connector 146 at the top surface of the IC package 120. The pillars 142 include two identical parallel conducting materials for each mm-wave signal path, and are optimized to guide a differential TEM mode signal from the IC package 120 to the micro-strip connector 146 at the top surface of the IC package 120. The pillars 142 may optionally be surrounded with an axial-metal waveguide shield 144.

Millimeter (mm) wave connections are realized by the pillars 142 from the active side of the IC package 120 to a micro-strip connector 146 at the top surface of the IC package 120. The pillars 142 include two identical parallel conducting materials for each mm-wave signal path, and are optimized to guide a differential TEM mode signal from the IC package 120 to the micro-strip connector 146 at the top surface of the IC package 120. The pillars 142 may optionally be surrounded with an axial-metal waveguide shield 144.

Specific embodiments include a waveguide antenna 160 and an IC package 120, which further includes circuitry 140 to propagate signals from the IC package 120 through the waveguide structure 110. Also, a plurality of bond wires 150 to connect the IC package 120 and a lead frame 130, and to carry signals from circuitry 140 of the IC package 120 to the board on which the IC package is mounted for transmission as radar and/or telecommunications signals via the waveguide antenna 160 are included.

Figure 2:
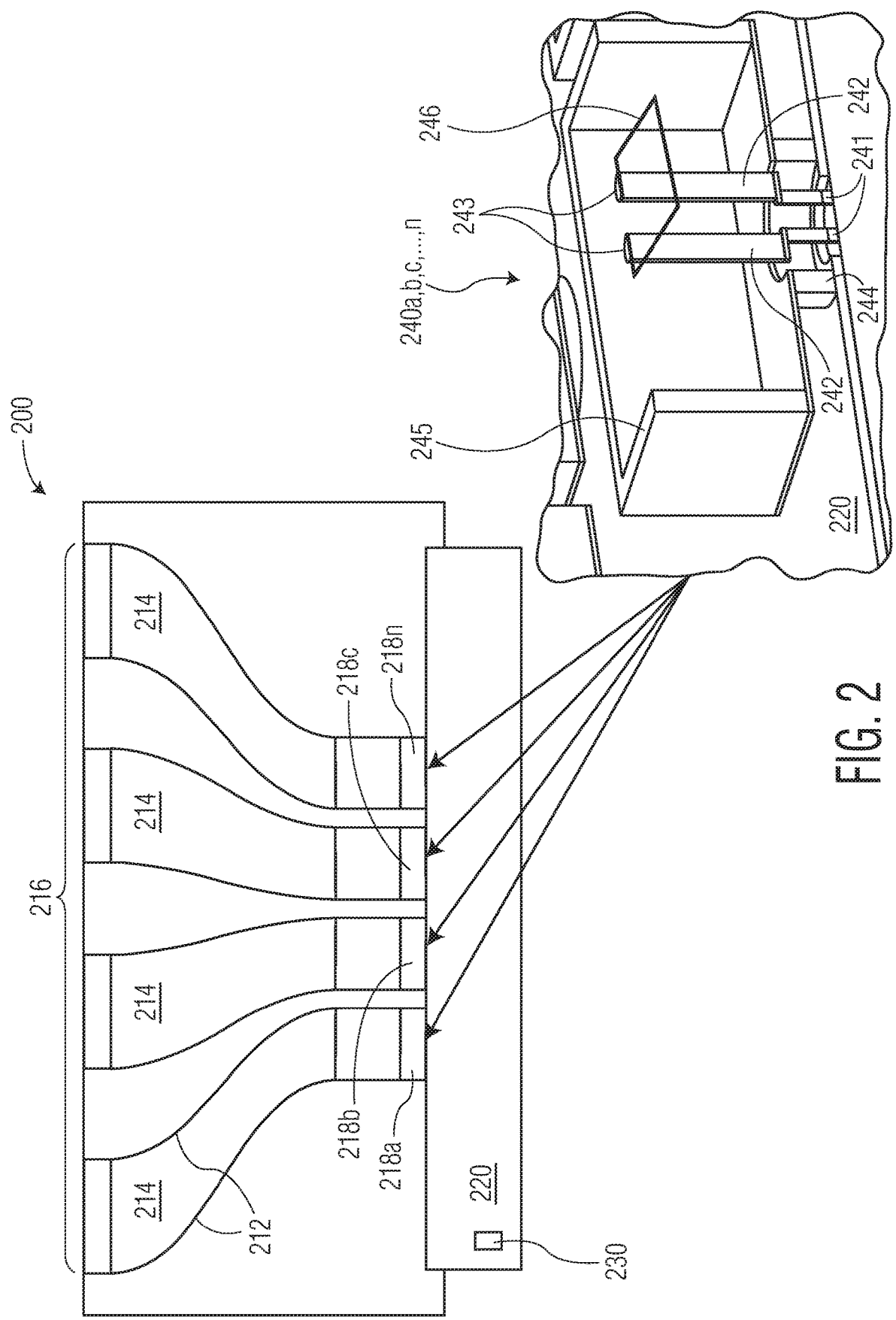
FIG. 2 illustrates an integrated circuit, in accordance with the present disclosure.

FIG. 2 illustrates an integrated circuit 200, in accordance with the present disclosure, including an IC package 220 a lead frame 230 and circuitry 240a, 240b, 240c, . . . , 240n (collectively 'circuitry 240') to communicate signals for radar communications and/or telecommunications applications. The waveguide structure 210, which includes conductive walls 212 characterizing one or more apertures 216 through which electro-magnetic signals are transmitted, is coupled to the IC package 220. Pillars 242 have a respective second end portion 243 which couples to micro-strip connector 246 located in close proximity of one or more slots 218a, 218b, 218c, . . . , 218n (collectively 'slot(s) 218') provide a mm-wave signal path. The pillars 242 have a respective first end portion 241 connected to the IC package 220 and second end portions 243 to connect to a waveguide antenna (as depicted, for example, in FIG. 1). Optional waveguide shields 244, 245 are included to provide electro-magnetic isolation of the pillars 242 as may or may not be needed or beneficial for a given application and design, and a micro-strip connector 246 provides connection between the second end portions 243 and to the waveguide antenna (not shown). Bond wires consistent with those depicted in FIG. 3 connect the IC package 220 and the lead frame 230, and carry the signals from the circuitry 240 of the IC package 220 to the board on which the IC package is mounted (e.g., 108 of FIG. 1A) for transmission via the waveguide antenna (e.g., 160 of FIG. 1A). The pillars 242 may be solid metal, organic pillars with a metal plating, or a combination thereof.

The waveguide structure 210 depicted in FIG. 2 is to provide a low impedance pathway 214 for the propagation of millimeter-wave signals in TE10 mode. The pathway 214 is to provide for the propagation of the millimeter-wave signals via guided TEM-wave signals, the pathway 214 having an optimized path length over which the millimeter-wave signals propagate so that attenuation by conductive and dielectric losses are minimized. Minimizing the path length via pillars 242 over which the mm-wave signals travel as a guided TEM-wave minimizes energy loss from attenuation due to dielectric and/or conductive losses as the signals propagate through the IC package 220 and waveguide structure 210.

In other embodiments, the waveguide structure 210 and the pillars 242 provide a plurality of different signal paths. The pillars 242 in combination with the optional waveguide shields 244, 245 are arranged to reduce undesired coupling between immediately-adjacent signal pathways communicatively connecting the waveguide structure 210 and circuitry 240 to the IC package 220. In various related embodiments, the IC package 220 can include an interface at which a micro-strip line 246 is to connect to the waveguide structure 210. The waveguide structure 210 defines a slot 218 through which non-galvanic proximity coupling with the micro-strip line 246 is achieved at the interface of the IC package 220. The slot 218 is further defined to minimize energy losses during mm-wave energy transfer. The non-galvanic proximity coupling between the micro-strip 246 at the surface of the IC package 220 and a slot 218 in the waveguide structure 220 can be used for efficient mm-wave energy transfer, thereby enabling the IC package 220 to be combined with different antenna types depending on the application. Coupling between the IC package 220 and antenna array of choice is achieved during the assembly process of the mm-wave communications device.

As depicted in FIG. 2, the conductive walls 212 of the apertures 216 of the waveguide structure 210 are curved. Size of the waveguide structure 210 is decreased to make the pitch between the apertures 216 smaller, allowing the overall size of integrated circuit 200 to be minimized. Further, a high permittivity material near the slot(s) 218 of the waveguide structure 210 provides a low impedance for the propagation of signals in TE10 mode. The low impedance that is characteristic of this material ensures the power which is radiated by the slot(s) 218 is transferred into the waveguide structure 210 instead of back into the IC package 220. Additionally and/or alternatively, metal strips/patches can be inserted into the conductive walls 212 of the waveguide structure 210 to achieve low impedance of the waveguide structure 210. Slots 218 couple the waveguide structure 210 to the micro-strip connector 246 included in the IC package 220.

In additional specific example embodiments, aspects of the present disclosure are directed to a method for transmitting and/or receiving signals for radar communication using a waveguide structure 210 coupled to an integrated circuit package 220. Pillars 242 in an aperture 216 of the waveguide structure 220 provide a mm-wave signal path from respective first end portions of the pillars 241 along the pillars 242 and to second end portions of the pillars 243 to connect to a waveguide antenna 160. Waveguide shields 244, 245 are used to provide electro-magnetic isolation for the pillars 242. A micro-strip connector 246 provides a connection between the second end portions 243 and to the waveguide antenna, launching mm-wave signals. The launching of mm-wave signals may cause the mm-wave signals to propagate in TE10 mode.

In more-specific embodiments, the waveguide shields 244, 245 can include multiple sets of pillars 242, each set of pillars 242 may optionally be surrounded by an axial-metal shield 244 to provide impedance control of a transmission line for the propagation of the mm-wave signals. Further, each of the multiple sets of pillars 242 is to present a differential signal for launching via a waveguide antenna 160.

Depicted in FIG. 3 is the interior of IC package 320, in accordance with the present disclosure. Circuitry 340 included in the IC package 320 can transmit or receive radar and/or telecommunications signals, and the circuitry 340 can be placed anywhere within the IC package 320. Bond-wires 350 connect the IC package 320 to a QFN lead frame 330. The QFN lead frame 330 has lead frame pads 332. Non-critical low frequency connections from the IC package 320 to the QFN lead frame 330 are realized through bond-wires 350 connected to the QFN lead frame pads 332. QFN lead frame pads 332 are soldered to the board, such as a PCB, on which the IC package is mounted during the manufacturing process. The IC package 320 can be enlarged without being limited by mechanical stresses resulting from the difference in thermal expansion coefficients of the different materials of which the PCB and bond-wires 350 are made, due to the bond-wires 350 being flexible.

FIG. 4A illustrates another detailed embodiment which relates to and can be used in connection with the aspects described above in connection with FIG. 3. Similar to the mm-wave connections disclosed with FIG. 3, in FIG. 4a mm-wave connections provide coupling for the active side of an integrated circuit package 420, and with a micro-strip connector 446 can be realized through the (conductive) pillars 442, which may be solid metal, organic with a metal plating, or a combination thereof, included in the circuitry 440 of a single channel (e.g., aperture 216 of FIG. 2) depicted in FIG. 4A. Additionally, the box-shaped waveguide shield 445 shield from spurious radiation between the circuitry 440 of adjacent channels included in the IC package 420. A micro-strip connector 446 couples to a slot in the bottom of a waveguide structure. Bond-wires 450 connect the IC package 420 and a lead frame and carry signals from circuitry 440 of the IC package 420 to the PCB (e.g., 108 of FIG. 1A) on which the package is mounted for transmission of radar and/or telecommunications signals via a waveguide antenna array coupled to the waveguide structure.

In more-specific example embodiments, aspects of the present disclosure are directed to a radar system having waveguide shields 444, 445 including axial-metal shields 444 to provide impedance control of a transmission line for the propagation of mm-wave signals in TE10 mode. Such axial shielding is optional for both impedance control and shielding. Included in the radar system are multiple sets of pillars 442 to present differential signal paths for launching via a waveguide antenna coupled to a waveguide structure. In more specific embodiments, the waveguide structure provides a transmission line for transmission of the signals carried from the circuitry 440 of the IC package 420 for transmission as radar signals from the waveguide antenna.

Figure 4B:
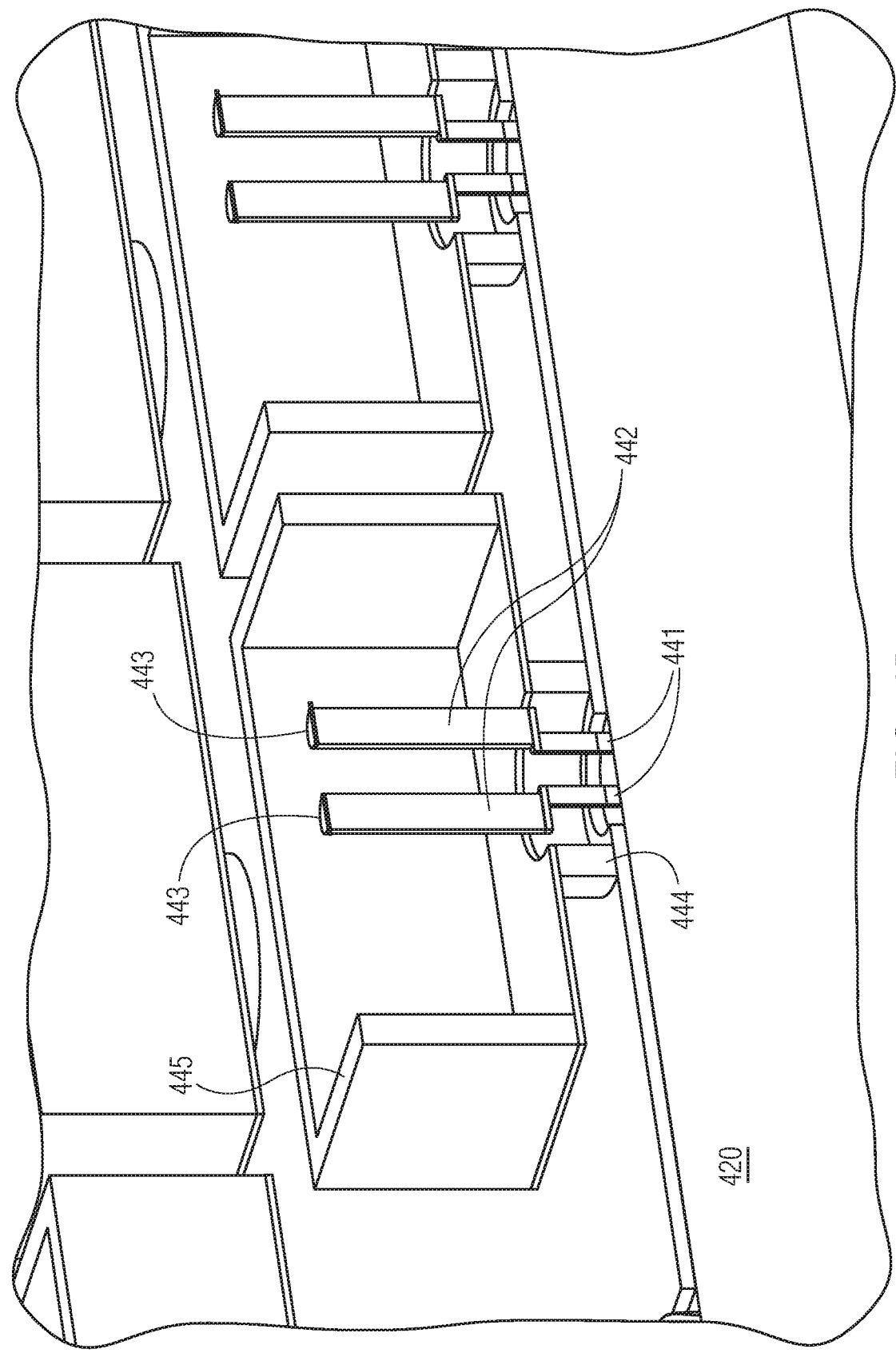
FIG. 4B represents a cross-section of the circuitry illustrated in FIG. 4A, in accordance with the present disclosure.

FIG. 4B is a cross-section of the circuitry depicted in FIG. 4A, better illustrating the first end portions 441 to connect an IC package 420, and second end portions 443 for coupling to a micro-strip connector of the pillars 442.

In specific embodiments, the pillars 442 depicted in FIG. 4A and FIG. 4B provide a plurality of different transmit and receive signal paths, which, in combination with the waveguide shields 444, 445 between the various signal paths reduce the undesired coupling between these closely spaced signal paths the circuitry 440 included in the IC package 420. A box-shaped waveguide shield 445 below a slot and/or a matching structure in a waveguide antenna array directs mm-wave energy in a desired direction of a waveguide structure for maximum isolation between signal paths, and for minimum signal loss during transmission.

Figure 5:
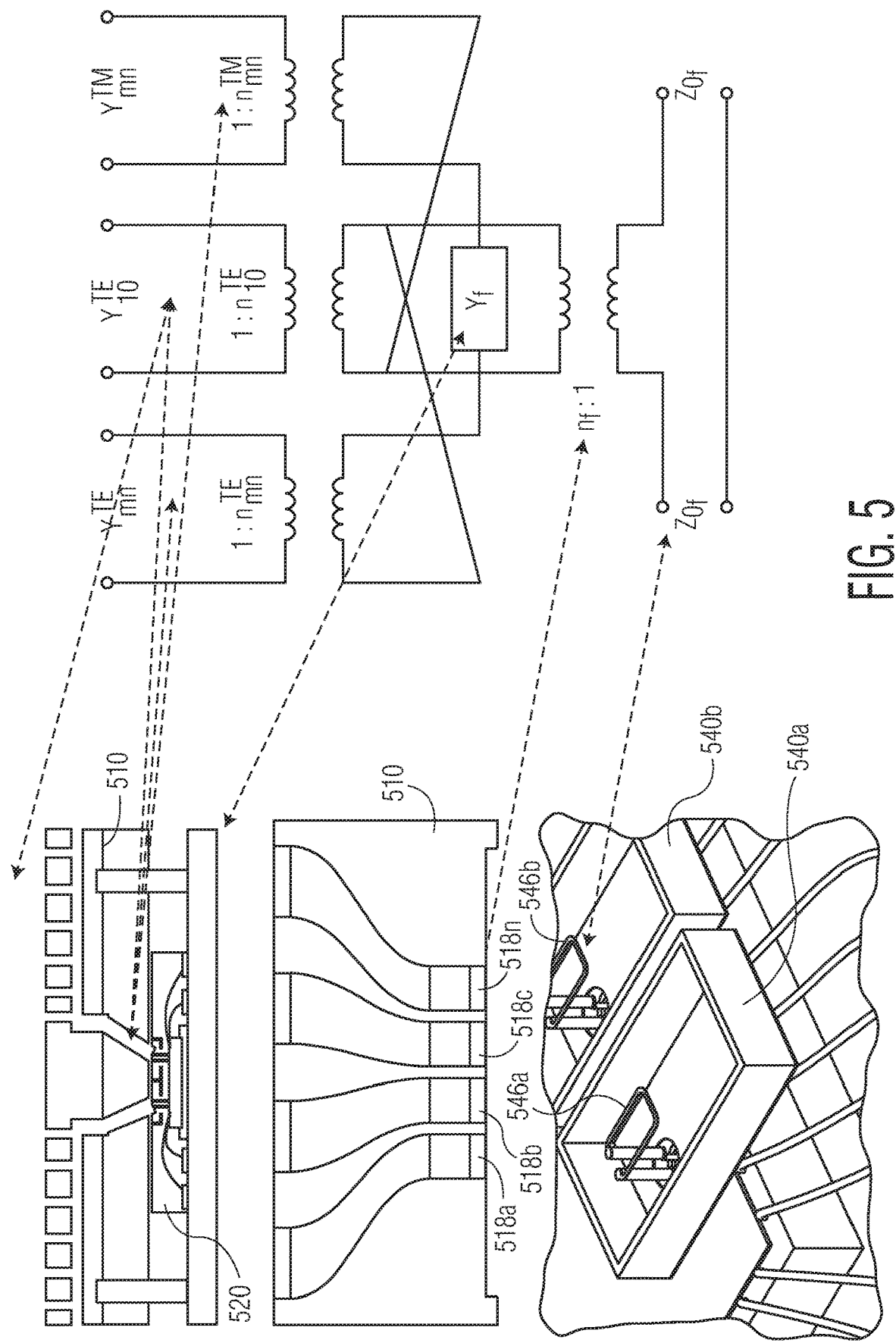
FIG. 5 presents a transmission line model of circuitry, in accordance with the present disclosure.

FIG. 5 illustrates an equivalent transmission line model representing aspects of the present disclosure. In this model, circuitry 540b includes a micro-strip connector 546b coupling to one of the slots 518a, 518b, 518c, . . . , 518n (collectively slot(s) 518') in the waveguide structure 510, as modelled by a transmission-line with impedance $Z_o$. The coupling from the micro-strip connector 546b to the slot 518 in the waveguide structure 510 can be modelled by a transformer with turns ratio of $n_f$, which is a function of the electric field in the slot 518 and the magnetic field of the micro-strip connector 546b. The desired propagating waveguide mode is depicted by transmission with characteristic impedance of TE10 mode. The other transmission lines represent non-propagating waveguide modes in which reactive energy is stored. Shunt admittance $Y_f$ models the power flow into the IC package 520. $Y_f$ has both an imaginary ($B_f$) and real ($G_f$) component which model the power transmitted into/reflected from the IC package 520, respectively. The ratio of power flow into the waveguide structure 510 and into the IC package 520 can be characterized by the ratio of the conductances $G_w$ and $G_f$, where $G_w$ is the real part of the admittance looking into the waveguide structure 510. This ratio can be optimized by using a quarter wave piece of high dielectric material to increase $G_w$, and $G_f$ is minimized by using a cavity which may be included in the IC package 520.

In accordance with specific more-detailed/experimental embodiments which are consistent with the above-described embodiments, electromagnetic-simulation results of the related transfer properties show significant performance of systems such as in FIG. 1, for example, in comparison to previously-implemented approaches which do not include the above-noted features such as each of the pillars having a first end portion to connect to the IC package and a second end portion to connect to a waveguide antenna, waveguide shields to provide electro-magnetic isolation for the pillars, a micro-strip connector to provide connection between the second end portions and the waveguide antenna, and/or bond-wires to connect the IC package and a lead frame and to carry signals from circuitry of the IC package to the PCB on which the package is mounted for transmission of radar signals via the waveguide antenna. Through such electromagnetic-simulation results, the following is observed for the example target frequency band of between 76 GHz and 81 GHz: less than 0.1 dB of signal power is lost due to reflection or due to energy leaking from the structure; and less than 0.7 dB of signal power is lost in case material loss are included. Such loss is significantly lower than that of the previously-implemented approaches and, as may be important, serves to further reduce the overall link budget associated with a full duplex Radar system (e.g., by less than 1.4 dB when this transition is applied for both transmitter and receiver IC to wave-guide interfaces).

In certain specific embodiments, aspects of the present disclosure are directed to a structure for coupling mm-wave signals from an IC package, packed in a modified Quad Flat No-Lead (QFN) package, to a waveguide structure, in accordance with the present disclosure, permits waveguides to be affixed (e.g., glued) to an IC package. As one example in a specific embodiment directed to a related microstructure as illustrated herein, such a QFN package can be implemented in Through Polymer Via (TPV) technology, and the waveguide antenna arrays can be realized through low-loss, low-cost Molded Injection Device (MID) processes. Such a low-loss, low-cost connection between an IC package and a waveguide structure can be sufficient to isolate the transmit and receive signal paths of the transceiver IC. Additionally and/or alternatively pillars can be used to connect an IC package to a waveguide structure. Waveguide shields surround the pillars to provide electro-magnetic isolation between the pillars.

With reference to the examples shown in FIGS. 1-4 and the illustrated equivalent transmission-line model showing optimized energy transfer between a transceiver IC and a waveguide antenna array, such a transmission-line can be used in various applications involving high-performance IC to waveguide antenna interfaces including, for example, car radar systems operating in the 76-81 GHz frequency band. As one non-limiting example using FIG. 3 for illustrative purposes, while operating in the target frequency band of 76-81 GHz, less than 0.1 dB of signal power is lost due to reflection and/or due to energy leaking from the (waveguide) structure, and less than 0.7 dB of signal power is lost when factoring in material losses.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, connectors, and/or other circuit-type depictions (e.g., reference numerals 142 and 146 of FIG. 1 depict a block/module as described herein). Such circuits or circuitry are used together with other elements to exemplify how certain embodiments may be carried out in the form or structures, steps, functions, operations, activities, etc. For example, where the Specification may make reference to a "first [type of structure]", a "second [type of structure]", etc., where the [type of structure] might be replaced with terms such as ["circuit", "circuitry", "connectors" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus comprising:
  a waveguide structure to couple an integrated circuit (IC) package and including a plurality of pillars to provide a path for carrying millimeter-wave signals, each of the plurality of pillars having a first end portion to connect to the IC package and a second end portion to pass waveguided energy to a waveguide antenna;
  a plurality of waveguide shields to provide electro-magnetic isolation for the plurality of pillars and a plurality of bond wires to connect the IC package and a lead frame and to carry signals from circuitry of the IC package to the board on which the IC package is mounted for transmission of radar signals via the waveguide antenna; and
  a micro-strip connector to provide connection between the second end portions and to the waveguide antenna.

2. The apparatus of claim 1, further including
  the waveguide antenna;
  the IC package including circuitry to send signals from the IC package; and
  a plurality of bond wires to connect the IC package and a lead frame and to carry signals from circuitry of the IC to the board on which the IC package is mounted for transmission of radar signals via the waveguide antenna.

3. The apparatus of claim 1, wherein the waveguide structure is to provide a low impedance pathway for the propagation of the millimeter-wave signals in TE10 mode.

4. The apparatus of claim 1, wherein the waveguide structure is to provide a pathway for the propagation of the millimeter-wave signals via guided TEM-wave signals, the pathway having an optimized path length over which the millimeter-wave signals propagate so that attenuation by conductive and dielectric losses are minimized.

5. The apparatus of claim 1, wherein the waveguide structure and the plurality of pillars provide a plurality of differential signal paths, the plurality of pillars in combination with the plurality of waveguide shields being arranged to reduce undesired coupling between immediately-adjacent signal pathways communicatively connecting the waveguide structure and circuitry in the IC package.

6. The apparatus of claim 1, wherein the IC package includes an interface surface at which a micro-strip line is to connect to the waveguide structure, and the waveguide structure defines a slot through which non-galvanic proximity coupling is provided with the micro-strip line at the interface surface of the IC package, the slot being defined to minimize energy losses during mm-Wave energy transfer.

7. A radar system comprising:
  an integrated circuit (IC) including
    an IC package,
    lead frame, and
    circuitry to communicate signals for radar communications;
  a waveguide structure coupled to the IC package and including
    conductive walls characterizing one or more apertures through which electro-magnetic signals are transmitted,
    a plurality of pillars located in the IC package to provide a mm wave signal path and having respective first end portions to connect to the IC package and second end portions to connect to a waveguide antenna,
    a plurality of waveguide shields to provide electro-magnetic isolation for the plurality of pillars, and
    micro-strip connector to provide connection between the second end portions and to the waveguide antenna; and
  a plurality of bond wires to connect the IC package and the lead frame and to carry the signals from the circuitry of the IC to the board on which the IC package is mounted for transmission via the waveguide antenna.

8. The radar system of claim 7, wherein the plurality of waveguide shields includes axial-metal shields to provide impedance control of a transmission line for the propagation of the millimeter-wave signals in TE10 mode.

9. The radar system of claim 7, wherein the plurality of pillars includes multiple sets of two pillars to present a differential signal for launching via the waveguide antenna.

10. The radar system of claim 7, wherein the waveguide structure provides a transmission line for transmission of the signals carried from the circuitry of the IC for transmitting as radar signals from the waveguide antenna.

11. A method for use in a waveguide structure being coupled to an integrated circuit (IC) package, the method comprising:
   communicating, by transmitting and/or receiving signals, from circuitry in the IC package for radar communication;
   using a plurality of pillars in an aperture of the waveguide structure to provide a mm wave signal path from and respective first end portions of the plurality of pillars, along the plurality of pillars and to second end portions of the plurality of pillars to connect to a waveguide antenna, wherein the plurality of waveguide shields includes multiple sets of pillars, each set surrounded by an axial-metal shield to provide impedance control of a transmission line for the propagation of the millimeter-wave signals;
   using waveguide shields to provide electro-magnetic isolation for the plurality of pillars; and
   via a micro-strip connector to provide connection between the second end portions and the waveguide antenna, launching the millimeter-wave signals.

12. The method of claim 11, wherein launching includes causing the millimeter-wave signals to propagate in TE10 mode.

13. The method of claim 11, wherein each of the multiple sets of pillars is to present a differential signal for launching via the waveguide antenna.

14. An apparatus comprising:
   a waveguide structure to couple an integrated circuit (IC) package and including a plurality of pillars to provide a path for carrying millimeter-wave signals, each of the plurality of pillars having a first end portion to connect to the IC package and a second end portion to pass waveguided energy to a waveguide antenna; and
   a micro-strip connector to provide connection between the second end portions and to the waveguide antenna;
   wherein the IC package includes an interface surface at which a micro-strip line is to connect to the waveguide structure, and the waveguide structure defines a slot through which non-galvanic proximity coupling is provided with the micro-strip line at the interface surface of the IC package, the slot being defined to minimize energy losses during mm-Wave energy transfer.

15. The apparatus of claim 14, further including the waveguide antenna;
   the IC package including circuitry to send signals from the IC package; and
   a plurality of bond wires to connect the IC package and a lead frame and to carry signals from circuitry of the IC to the board on which the IC package is mounted for transmission of radar signals via the waveguide antenna.

16. The apparatus of claim 14, wherein the waveguide structure is to provide a low impedance pathway for the propagation of the millimeter-wave signals in TE10 mode.

17. The apparatus of claim 14, wherein the waveguide structure is to provide a pathway for the propagation of the millimeter-wave signals via guided TEM-wave signals, the pathway having an optimized path length over which the millimeter-wave signals propagate so that attenuation by conductive and dielectric losses are minimized.

18. The apparatus of claim 14, wherein the waveguide structure and the plurality of pillars provide a plurality of differential signal paths, the plurality of pillars in combination with the plurality of waveguide shields being arranged to reduce undesired coupling between immediately-adjacent signal pathways communicatively connecting the waveguide structure and circuitry in the IC package.

* * * * *